United States Patent
Lee (10) Patent No.: US 8,216,899 B2
(45) Date of Patent: Jul. 10, 2012

(54) FLASH MEMORY DEVICE AND METHOD MANUFACTURING THE SAME

(75) Inventor: Byoung Ki Lee, Chungcheongbuk-do (KR)

(73) Assignee: Hynix Semiconductor Inc., Icheon-si (KR)

( * ) Notice: Subject to any disclaimer, the term of this patent is extended or adjusted under 35 U.S.C. 154(b) by 119 days.

(21) Appl. No.: 12/607,183

(22) Filed: Oct. 28, 2009

(65) Prior Publication Data

US 2010/0181608 A1    Jul. 22, 2010

(30) Foreign Application Priority Data

Jan. 21, 2009 (KR) .................. 10-2009-0005062

(51) Int. Cl.
*H01L 21/336* (2006.01)
(52) U.S. Cl. ........ 438/258; 438/257; 438/266; 438/424; 438/427; 438/593
(58) Field of Classification Search .................. 438/258, 438/424, 427, 257, 266, 593
See application file for complete search history.

(56) References Cited

U.S. PATENT DOCUMENTS

| | | | | |
|---|---|---|---|---|
| 7,064,379 B2 * | 6/2006 | Kutsukake et al. | ........... | 257/315 |
| 7,138,314 B2 * | 11/2006 | Song et al. | ........... | 438/258 |
| 7,338,860 B2 * | 3/2008 | Kwon | ........... | 438/257 |
| 7,847,337 B2 * | 12/2010 | Iwase et al. | ........... | 257/316 |
| 7,906,396 B1 * | 3/2011 | Chiang et al. | ........... | 438/258 |

FOREIGN PATENT DOCUMENTS

| | | |
|---|---|---|
| KR | 10-2008-0060600 | 7/2008 |
| KR | 10-2009-0000987 | 1/2009 |

* cited by examiner

*Primary Examiner* — Bac Au
(74) *Attorney, Agent, or Firm* — Marshall, Gerstein & Borun LLP (57) ABSTRACT

According to the present disclosure, a flash memory device includes a semiconductor substrate that includes selection transistor regions and a memory cell region defined between the selection transistor region, first isolation layers formed in the selection transistor regions, and second isolation layers formed in the memory cell region. The second isolation layers have a lower height than the first isolation layers.

14 Claims, 7 Drawing Sheets

FLASH MEMORY DEVICE AND METHOD MANUFACTURING THE SAME

CROSS-REFERENCE TO RELATED APPLICATION

Priority to Korean patent application number 10-2009-0005062 filed on Jan. 21, 2009, the entire disclosure of which is incorporated by reference herein, is claimed.

BACKGROUND

1. Field of the Invention

The present disclosure is directed to a flash memory device and a method of manufacturing the same. More particularly, the present disclosure is directed to a flash memory device having contact holes formed in a dielectric layer, and a method of manufacturing the same.

2. Brief Description of Related Technology

The cell array of a flash memory device includes a string structure. The string structure includes a drain select transistor having a drain coupled to a bit line, a source select transistor having a source coupled to a common source line, and a number of memory cells coupled in series between the drain select transistor and the source select transistor. A number of the string structures are formed in parallel and are electrically isolated from each other by an isolation layer. Furthermore, each of the drain select transistor, the source select transistor, and the memory cell includes a gate having a stack-type structure in which a floating gate, a dielectric layer, and a control gate are stacked. In the string structures formed in parallel, the control gates of the drain select transistors are interconnected to form a drain select line, the control gates of the source select transistors are interconnected to form a source select line, and the control gates of the memory cells are interconnected to form a word line. On the other hand, the floating gates of the source and drain select transistors are electrically coupled to the control gates of the source and drain select transistors through contact holes formed in the dielectric layers. That is, the source select line and the drain select line are electrically coupled to the underlying floating gates of the source and drain select transistors through the contact holes formed in the dielectric layers.

A prior art method of forming the contact holes in the dielectric layers is described in detail below.

First, a gate insulating layer, a conductive layer for the floating gates, and an isolation hard mask pattern are formed over a semiconductor substrate. The conductive layer for the floating gates, the gate insulating layer, and the semiconductor substrate are etched by an etch process using the isolation hard mask pattern as an etch barrier. Trenches are formed in portions in which the semiconductor substrate has been etched, and active regions are defined in regions on the semiconductor substrate parallel to the trenches. Thus, the conductive layer for the floating gates and the gate insulating layer remain on the active regions.

After the trenches are formed, the trenches are gap-filled with an insulation material, and the conductive layer for the floating gates is exposed by a polishing process. Accordingly, the insulation material remains within the trenches to thereby form isolation layers, and the active regions are defined in regions on the semiconductor substrate parallel to the isolation layers. The isolation layer is formed to have a lower surface height than the surface of the conductive layer for the floating gates by controlling the effective field height (EFH). Consequently, a stepped topology is formed on a surface of the semiconductor substrate, including the isolation layer and the conductive layer for the floating gates.

The dielectric layer is formed on the surface of the semiconductor substrate having the stepped topology, including the isolation layer and the conductive layer for the floating gates. The surface of the dielectric layer also has a stepped topology because the dielectric layer is formed on the surface of the semiconductor substrate having the stepped topology (see FIG. 1). Thus, if auxiliary layers, such as a capping layer and a bottom anti-reflective coating (BARC) layer, are stacked over the dielectric layer in a subsequent process, the thickness of the auxiliary layers is thicker on the isolation region than on the active region.

In the state in which the thickness of the auxiliary layers is not uniform as described above, a photoresist pattern is formed over the auxiliary layers. The photoresist pattern is used as a pattern which defines regions where the contact holes will be formed. The contact holes are formed in the dielectric layer by etching the auxiliary layers and the dielectric layer using an etch process using the photoresist pattern as an etch barrier. When the contact holes are formed in the dielectric layer, the thickness of layers (i.e., etch targets) is not uniform because of the stepped topology previously described, thereby making it difficult to secure a reasonable margin of error for the etch process. Consequently, the contact holes may not be formed in part of the dielectric layer, and a connection failure may occur between the select lines and the conductive layer for the floating gates. Furthermore, in the process of etching the auxiliary layers when the contact holes are formed in the dielectric layer, it is difficult to control the etch targets. Accordingly, there is a limit to an increase in the contact area.

Figure 1:
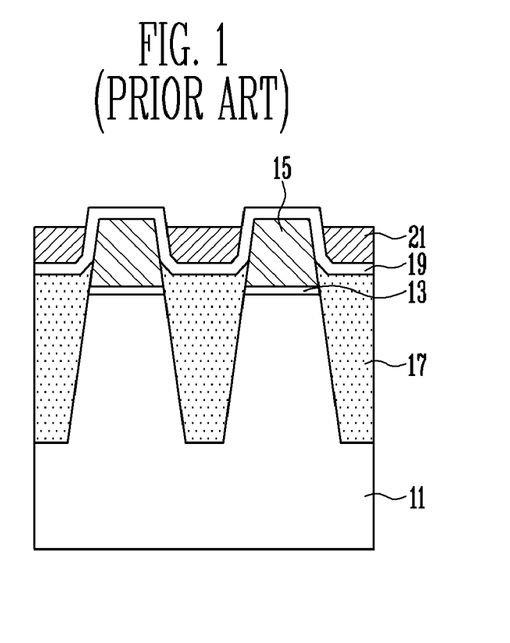
FIG. 1 is a sectional view showing a prior art process of forming contact holes in a dielectric layer.

FIG. 1 is a section view illustrating a process of forming contact holes in a dielectric layer. In FIG. 1, regions where the contact holes (not shown) are formed intersecting isolation layers.

Referring to FIG. 1, steps are formed on the entire surface of a semiconductor substrate 11 as a result of the isolation layers 17. Thus, when forming the contact holes in the dielectric layer 19, portions of an auxiliary layer 21 over a conductive layer 15 for the floating gates are exposed and removed earlier than portions of the auxiliary layer 21 over the isolation layers 17. On the other hand, in order to improve the contact resistance of the conductive layer 15 for floating gates and a source select line or a drain select line which is formed later, a contact area of the conductive layer 15 for floating gates and the source select line or the drain select line must be widened. To this end, portions of the auxiliary layer 21 exposed over the isolation layers 17 have to be removed so that the sidewalls of the conductive layer 15 for the floating gates are exposed. However, when controlling the EFH, the height of the isolation layer 17 is lowered, which makes the auxiliary layer 21 over the isolation layer 17 close to a gate insulating layer 13. Accordingly, it is difficult to control the etch thickness of the auxiliary layer 21 without damaging the gate insulating layer 13, and also there is a limit to an increase in the contact area.

BRIEF SUMMARY

Embodiments of the present disclosure are directed to a method of manufacturing a flash memory device which can improve an etch margin of error in a process of forming contact holes in a dielectric layer and can also increase a contact area of a select line and a floating gate.

A flash memory device according to an embodiment of the present disclosure includes a semiconductor substrate that includes selection transistor regions and a memory cell region defined between the selection transistor regions, first isolation layers formed in the selection transistor regions, and second isolation layers formed in the memory cell region, wherein the second isolation layers have a lower height than the first isolation layers.

A flash memory device according to another embodiment of the present disclosure includes a semiconductor substrate that includes selection transistor regions and a memory cell region defined between the selection transistor regions, a gate insulating layer formed on the semiconductor substrate, and a conductive layer formed on the gate insulating layer, the conductive layer having first conductive layers disposed in the selection transistor regions and second conductive layers disposed in the memory cell region, the first conductive layers being recessed and having concave top surfaces.

The first conductive layers can be separated from each other by first isolation layers interposed between adjacent first conductive layers. The second conductive layers can be separated from each other by second isolation layers interposed between adjacent second conductive layers. The second isolation layers can have a lower higher than the first isolation layers.

A method of manufacturing a flash memory device according to an embodiment of the present disclosure includes providing a semiconductor substrate that includes selection transistor regions and a memory cell region defined between the selection transistor regions, and forming first isolation layers in the selection transistor regions and forming second isolation layers having a lower height than the first isolation layers in the memory cell region.

The selection transistor regions comprise a source selection transistor region and a drain selection transistor region. The memory cell region is defined between the source selection transistor region and the drain selection transistor region.

The first isolation layers and the second isolation layers can be adjacent and coupled to each other.

The first isolation layers in the selection transistor regions and the second isolation layers having a lower height than the first isolation layers in the memory cell region can be formed by forming the first and second isolation layers to a same height, forming a first photoresist pattern configured to cover the first isolation layers and to expose the second isolation layers, lowering the height of the second isolation layers by performing an etch process using the first photoresist pattern as an etch barrier, and removing the first photoresist pattern.

The semiconductor substrate can further include a peripheral region. Third isolation layers having a same height as the first and second isolation layers can also be formed in the peripheral region when forming the first and second isolation layers to the same height. The first photoresist pattern can also be formed to further cover the third isolation layer.

The first and second isolation layers can be formed to the same height by stacking a gate insulating layer and a conductive layer over the semiconductor substrate, forming trenches by etching the conductive layer, the gate insulating layer, and the semiconductor substrate, thereby forming the first and second conductive layers, and gap-filling the trenches with an insulation material, and polishing a surface of the insulation material to expose the first and second conductive layer.

After the first photoresist pattern is removed, the height of the first and second isolation layers remains higher than the height of the gate insulating layer.

After the first photoresist pattern is removed, a dielectric layer can be formed over the semiconductor substrate, including the first and second isolation layers and the first and second conductive layers. The dielectric layer can be etched to expose the first conductive layers and the first isolation layers formed in the selection transistor regions. Select lines which contact the first conductive layers and the first isolation layers formed in the selection transistor regions and word lines which contact the dielectric layer formed in the memory cell region are formed.

After the dielectric layer is formed, a capping layer can be formed on the dielectric layer using, for example, polysilicon, a second photoresist pattern is formed over the capping layer, and the capping layer is etched by an etch process using the second photoresist pattern as an etch barrier.

The capping layer can be etched, for example, using an etch gas comprising HBr gas and $O_2$ gas.

After the dielectric layer is etched, the height of the first isolation layers remains higher than the height of the gate insulating layer. The height of the first isolation layers can be lowered and can become lower than the height of the first conductive layers.

The lowering of the height of the first isolation layer can be performed by a cleaning process using, for example, a hydrofluoric acid (HF) solution.

After the dielectric layer is etched, the height of the first isolation layers can becomes lower than the height of the first conductive layers. A cleaning process can be performed such that the height of the first isolation layers remains higher than the height of the gate insulating layer.

The cleaning process is performed using a hydrofluoric acid (HF) solution.

The select lines can contact a top surface and sidewalls of the first conductive layers.

After the dielectric layer is etched, surfaces of each of the first conductive layers disposed in the selection transistor regions can be recessed.

The recessing of the surfaces of the first conductive layers can be performed, for example, using an etch gas comprising HBr gas and N2 gas.

The recessing of the surfaces of the conductive layer can also be performed, for example, by applying a bias power that is lower than a bias power applied when the dielectric layer is etched.

A method of manufacturing a flash memory device according to an embodiment of the present disclosure can include providing a semiconductor substrate that includes selection transistor regions and a memory cell region defined between the selection transistor regions, stacking a gate insulating layer and a conductive layer over the semiconductor substrate, wherein the conductive layer comprises first conductive layers disposed in the selection transistor regions and second conductive layers disposed in the memory cell region, and recessing surfaces of each of the first conductive layers so that the first conductive layers have concave top surfaces.

DESCRIPTION OF EMBODIMENTS

Hereinafter, the present disclosure will be described in detail in connection with embodiments with reference to the accompanying drawings. The drawing figures are provided to allow those having ordinary skill in the art to understand the scope of the embodiments of the disclosure, and are not intended to be limiting.

Figure 2:
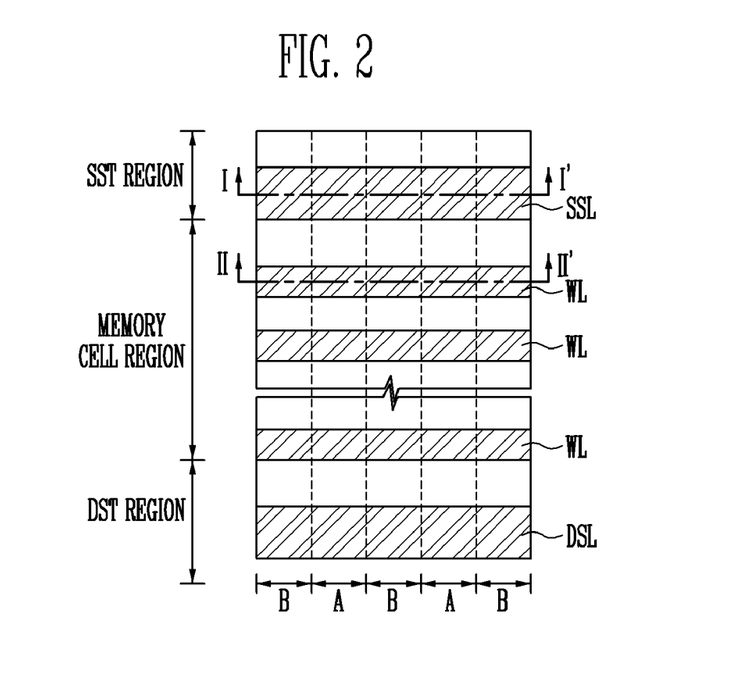
FIG. 2 is a layout diagram illustrating a flash memory device according to an embodiment.

FIG. 2 is a layout diagram illustrating a flash memory device according to an embodiment of the present disclosure. The cell array of the flash memory device includes a string structure. The string structure includes a drain select transistor having a drain coupled to a bit line, a source select transistor having a source coupled to a common source line, and a number of memory cells coupled in series between the drain select transistor and the source select transistor. A number of the string structures are formed in parallel and are electrically isolated from each other on the basis of an isolation layer. The source select transistor SST and the drain select transistor DST are formed in the selection transistor regions of the semiconductor substrate, and the memory cells are formed in the memory cell regions of the semiconductor substrate. The selection transistor regions include a source selection transistor (SST) region and a drain selection transistor (DST) region. The memory cell region is defined between the SST region and the DST region.

The memory cell region and the selection transistor regions include isolation regions B and active regions A, which are alternately defined in parallel to each other.

Furthermore, select lines are formed in the selection transistor region, and a number of word lines WL are formed in the memory cell region. The select lines include a drain select line DSL formed in the DST region and a source select line SSL formed in the SST region.

FIGS. 3A to 3F are sectional views sequentially showing a method of manufacturing the flash memory device in the direction of lines I-I' and II-II' shown in FIG. 2. The sectional view taken along line I-I' corresponds to the SST region of the selection transistor regions, but is identical to the sectional view of the DST region taken in the same direction as line I-I'. Accordingly, the sectional view taken along line I-I' corresponds to the sectional view of the selection transistor regions. The sectional view taken along line II-II' corresponds to the sectional view of the memory cell region.

Figure 3A:
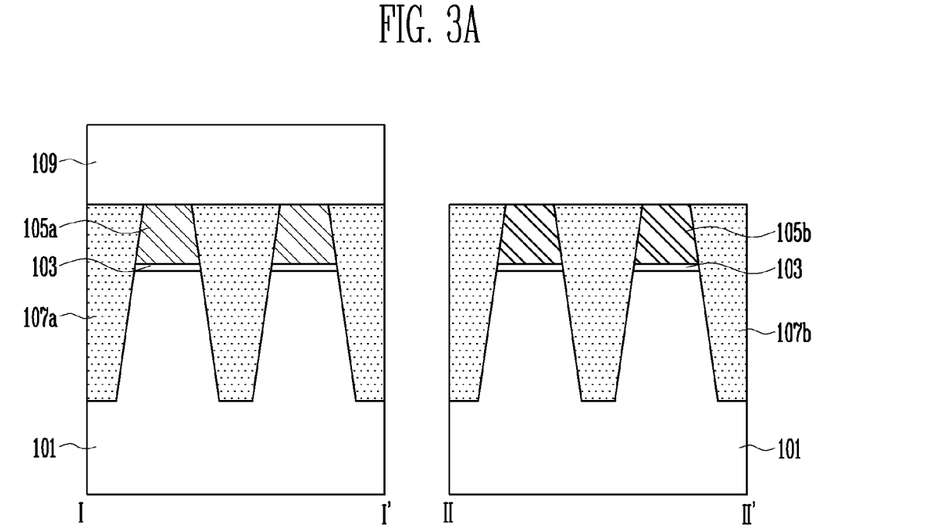
FIGS. 3A to 3F are sectional views sequentially showing a method of manufacturing the flash memory device in the direction of line I-I' and II-II' shown in FIG. 2.

Referring to FIGS. 2 and 3A, there is provided the semiconductor substrate 101, including the selection transistor regions and the memory cell region defined between the selection transistor regions. Each of the selection transistor region and the memory cell region includes the active regions A and the isolation regions B, which are alternately defined in parallel to each other. A gate insulating layer 103 and a conductive layer are stacked over the active regions A of the semiconductor substrate 101. The conductive layer includes first conductive layers 105a disposed in the selection transistor regions and the second conductive layers 105b disposed in the memory cell region. It will be understood that the term conductive layer can refer both individually and collectively to the conductive layer elements. Thus, it will be understood that the term "first conductive layers 105a" can refer to the conductive layer elements disposed in the selection transistor regions and separated by the isolation regions B of the selection transistor regions, and the term "second conductive layers 105b" can refer to the conductive layer elements disposed in the memory cell region and separated by the isolation regions B of the memory cell region. First isolation layers 107a are formed in the isolation regions B of the selection transistor regions, and second isolation layers 107b are formed in the respective isolation regions B of the memory cell region. It will be understood that the term isolation layer can refer both individually and collectively to the isolation layer elements. Thus, it will be understood that the term "first isolation layers 107a" can refer to the isolation layer elements disposed in the isolation regions B of the selection transistor regions, and the term "second isolation layers 107b" can refer to the isolation layer elements disposed in the isolation regions B of the memory cell region. The first isolation layers 107a and the second isolation layers 107b are adjacent to and connected to each other. A method of stacking the gate insulating layer 103 and the first and second conductive layers 105a and 105b over the active regions A and forming the first or second isolation layers 107a and 107b in the isolation regions B is described in detail below.

The gate insulating layer 103 and the conductive layer which is used to form the first and second conductive layers 105a and 105b are stacked over the semiconductor substrate 101. An isolation hard mask pattern (not shown) is formed on the conductive layer. The gate insulating layer 103 can be formed, for example, using an oxide layer, and the conductive layer (i.e., a conductive layer for floating gates) can be formed, for example, using polysilicon. The isolation regions B of the semiconductor substrate 101 are exposed by etching the conductive layer and the gate insulating layer 103, formed in the isolation regions B, using the isolation hard mask pattern as an etch mask. Accordingly, the first conductive layers 105a remain on the active regions A of the selection transistor regions, and the second conductive layers 105b remain on the active regions A of the memory cell region.

Trenches are formed in the semiconductor substrate 101 by etching the exposed isolation regions B. An insulating layer having a sufficient thickness is formed over the semiconductor substrate 101, including the trenches and the isolation hard mask pattern, to gap-fill the trenches. An oxide layer, for example, can be used as the insulating layer. Next, a surface of the insulating layer is polished by a polishing process. The polishing process can be performed, for example, using a chemical mechanical polishing (CMP) method. The polishing process is stopped when the first and second conductive layers 105a and 105b are exposed.

The first and second isolation layers 107a and 107b, which fill the inside of the trenches and have the same height, are formed through a series of the above processes. Furthermore, the gate insulating layer 103 and the first conductive layers 105a over the semiconductor substrate 101 disposed between adjacent first isolation layers 107a remain at the same height as the first isolation layers 107a, and the gate insulating layer 103 and the second conductive layers 105b over the semiconductor substrate 101 between adjacent second isolation layers 107b remain at the same height as the second isolation layers 107b.

In the state in which the surface of the first and second isolation layers 107a and 107b and the first and second conductive layers 105a and 105b are polished as described above, a first photoresist pattern 109 is formed which covers the first isolation layers 107a, but exposes the second isolation layers 107b. That is, the first photoresist pattern 109 is formed to cover the stack materials in the selection transistor regions, but to leave open (expose) the stack materials in the memory cell region.

Figure 3B:
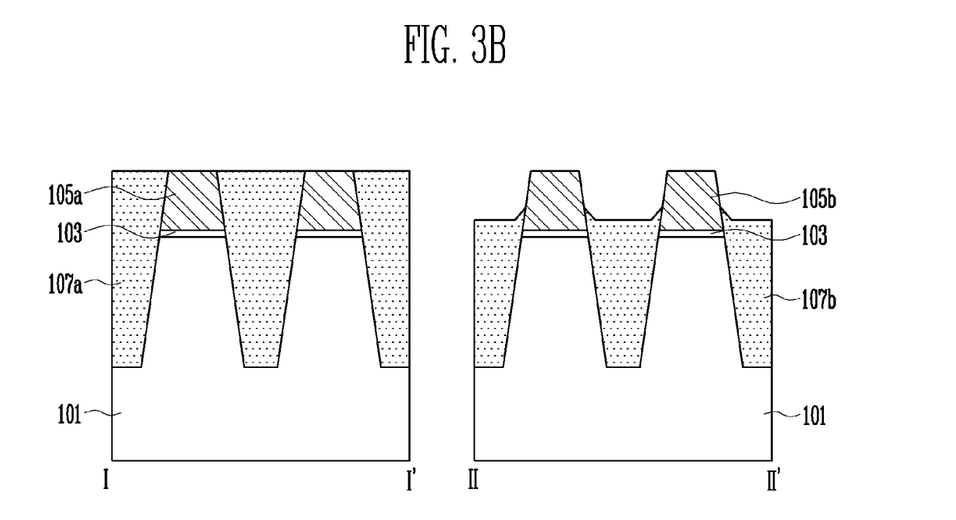

Referring to FIGS. 2 and 3B, the height of the second isolation layers 107b is lowered by an etch process using the first photoresist pattern (refer to 109 of FIG. 3A) as an etch barrier. Next, the first photoresist pattern (refer to 109 of FIG. 3A) is removed. Accordingly, the height of the second isolation layers 107b becomes lower than that of the first isolation layers 107a, and the first isolation layers 107a maintain the same height as the first conductive layers 105a. The height of the second isolation layers 107b can be controllably decreased (lowered) through control of the EFH. Here, the first and second isolation layers 107a and 107b are required to have a higher height than the height of the gate insulating layer 103 in order to prevent a reduction in the characteristic of the flash memory device.

Figure 3C:
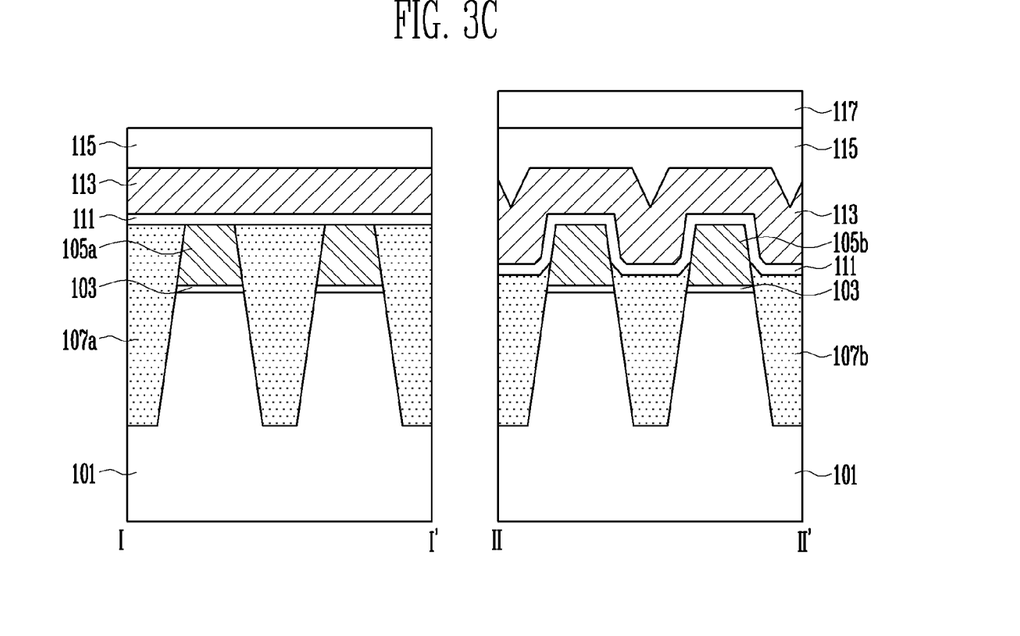

Referring to FIGS. 2 and 3C, a dielectric layer 111, a capping layer 113, and a BARC layer 115 are stacked over the semiconductor substrate 101, including the first and second isolation layers 107a and 107b and the first and second conductive layers 105a and 105b. A second photoresist pattern 117 is formed to cover the BARC layer 115 formed in the memory cell region, and to leave open (expose) the BARC layer 115 formed in the selection transistor regions.

The dielectric layer 111 can have, for example, a stack structure of an oxide layer/a nitride layer/an oxide layer. The capping layer 113 can be formed, for example, using polysilicon. Here, the capping layer 113 functions to protect the dielectric layer 111 formed in the memory cell region from an etch process, and it may be used as the bottom of a word line. The BARC layer 115 is formed using, for example, a mixture including an organic matter and is formed to prevent diffused reflection when an exposure process for forming the second photoresist pattern 117 is performed, thereby improving the profile of the second photoresist pattern 117.

In the present disclosure, the dielectric layer 111, the capping layer 113, and the BARC layer 115 in the selection transistor regions have a uniform thickness because they are stacked on the surface of the semiconductor substrate 101, including the first isolation layers 107a and the first conductive layers 105a, after it has been polished.

Figure 3D:
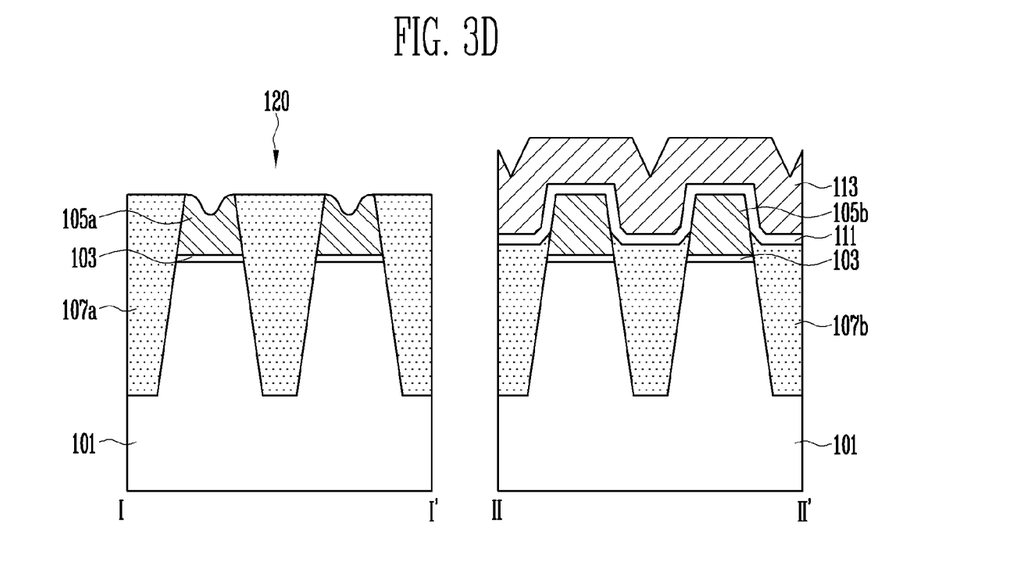

Referring to FIG. 2 and FIG. 3D, the BARC layer (refer to 115 of FIG. 3C), the capping layer 113, and the dielectric layer 111 formed in the selection transistor regions are sequentially etched by an etch process using the second photoresist pattern (refer to 117 of FIG. 3C) as an etch barrier. Next, the BARC layer (refer to 115 of FIG. 3C) and the second photoresist pattern (refer to 117 of FIG. 3C) which remain intact are removed. Accordingly, contact holes 120, which expose the first conductive layers 105a and the first isolation layers 107a formed in the selection transistor regions, are formed in the dielectric layer 111.

When sequentially etching the BARC layer (refer to 115 of FIG. 3C), the capping layer 113, and the dielectric layer 111 by the etch process using the second photoresist pattern (refer to 117 of FIG. 3C), the etch process preferably is performed with a relative etch selectivity taken into consideration. For example, when etching the BARC layer 115, an etch material preferably is used which has a high etch selectivity for the BARC layer (refer to 115 of FIG. 3C) made of the mixture, for example, including the organic matter, as compared to the capping layer 113 made, for example, of polysilicon. Furthermore, when etching the capping layer 113, an etch material preferably is used which has a high etch selectivity for the capping layer 113 formed, for example, of polysilicon as compared to the dielectric layer 111. An etch gas including a mixture of HBr gas and $O_2$ gas preferably is used as the etch material having a high etch selectivity for the capping layer 113 formed of polysilicon as compared to the dielectric layer 111. Furthermore, when etching the dielectric layer 111, an etch material preferably is used which has a high etch selectivity for the dielectric layer 111 as compared to the first conductive layers 105a.

When performing the etch process using the second photoresist pattern (refer to 117 of FIG. 3C) as described above, the BARC layer (refer to 115 of FIG. 3C), the capping layer (refer to 113 of FIG. 3C), and the dielectric layer 111 (i.e., etch targets) are formed to have a uniform thickness, thereby being capable of securing an etch margin. In more detail, in the present disclosure, the etch targets (i.e., the BARC layer (refer to 115 of FIG. 3C), the capping layer (refer to 113 of FIG. 3C), and the dielectric layer 111 formed in the selection transistor regions) are stacked over the first conductive layers 105a and the first isolation layers 107a. Accordingly, there are no steps in the structure because the first conductive layers 105a and the first isolation layers 107a have the same height. In other words, the BARC layer (refer to 115 of FIG. 3C), the capping layer (refer to 113 of FIG. 3C), and the dielectric layer 111 can be uniformly formed in the selection transistor regions without steps. Consequently, when performing the etch process using the second photoresist pattern (refer to 117 of FIG. 3C), the occurrence of an open failure can be prevented because the etch thickness can be easily set and the etch targets can be uniformly etched. Furthermore, since the second isolation layers 107b (i.e., the etch targets) in the memory cell region are etched to have a lower height than the first isolation layers 107a in the selection transistor region, the distance between the first isolation layers 107a and the gate insulating layer 103 is large as compared with the prior art. Accordingly, in the present disclosure, when etching the first isolation layers 107a in the selection transistor regions, damage to the gate insulating layer 103 can be prevented and the etch thickness of the first isolation layers 107a can be easily controlled.

After the first conductive layers 105a are exposed by the etch process for the dielectric layer 111, a process of recessing the first conductive layers 105a formed in the selection transistor regions can be further performed so that a top surface of each of the first conductive layers 105a is made concave, as shown in FIG. 3D. In order for the top surface of the each of the first conductive layers 105a to become concave, a recess process using, for example, a mixed etch gas of HBr gas and $N_2$ gas may be performed, or a recess process may be performed, for example, by lowering a bias power as compared with when the dielectric layer 111 and the capping layer 113 are etched. When the top surface of each of the first conductive layers 105a becomes concave through such a recess process, a contact area of the first conductive layers 105a and select lines formed in a subsequent process can be improved, which can improve the contact resistance therebetween. The first conductive layers 105a formed in the selection transistor regions may have different surface forms according to conditions used in the recess process.

Figure 3E:
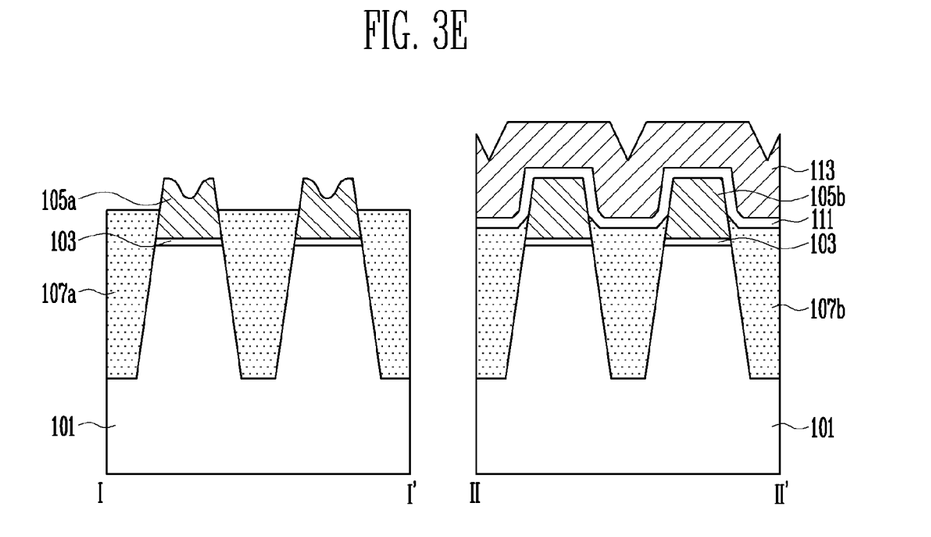

Referring to FIGS. 2 and 3E, after the first conductive layers 105a and the first isolation layers 107a formed in the selection transistor regions are exposed, a process of removing the etch remnants is performed using a cleaning process using, for example, a hydrofluoric acid (HF) solution. The height of the first isolation layers 107a becomes lower than that of the first conductive layers 105a by such a cleaning process, thereby exposing the sidewalls of the first conductive layers 105a formed in the selection transistor regions. Accordingly, a contact area of the first conductive layers 105a formed in the selection transistor regions and select lines formed in a subsequent process can be further improved, and so the contact resistance therebetween can be further improved. Meanwhile, although the height of the first isolation layers 107a becomes lower than that of the first conductive layers 105a through the cleaning process, it remains higher than the height of the second isolation layers 107b.

Figure 3F:
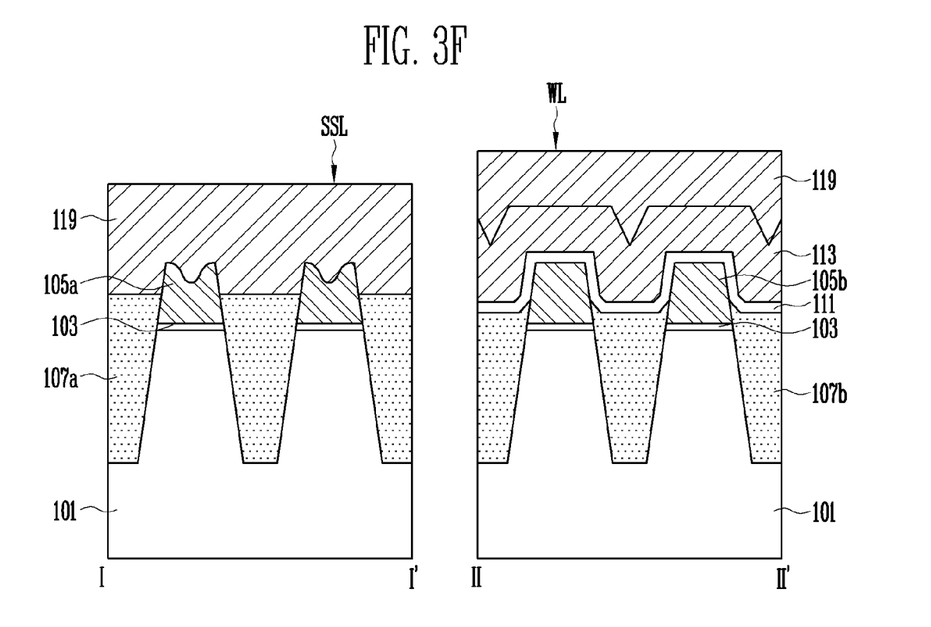

Referring to FIGS. 2 and 3F, a conductive layer 119 for control gates is deposited in the selection transistor regions, including the first conductive layers 105a and the first isolation layers 107a, and on the memory cell region including the dielectric layer 111. An etch process is performed so that the conductive layer 119 for control gates can be divided on a line basis, thereby forming the select lines, including the source select line SSL and the drain select line DSL, and the word lines WL.

The select lines are formed in the selection transistor regions so that they come in contact with the first conductive layers 105a and the first isolation layers 107a. Further, the word lines WL are formed on the dielectric layer 111 remaining in the memory cell region.

Next, the first and second conductive layers 105a and 105b on the active regions A and the dielectric layer 111 which have been left exposed by the formation of the select lines and the word lines WL, are etched. Consequently, the dielectric layer 111 and the first and second conductive layers 105a and 105b on the active regions A remain only under the select lines and the word lines WL.

As described above, according to the present disclosure, when lowering the height of the second isolation layers 107b of the memory cell region by controlling the EFH, the first isolation layers 107a of regions where the select lines will be formed have the same height as the first conductive layers 105a. Thus, in the process of forming the contact holes in the dielectric layer 111, steps can be prevented from occurring between the first conductive layers 105a and the first isolation layers 107a of regions where the select lines will be formed. Accordingly, the present disclosure can secure an etch margin because the thickness of layers (i.e., etch targets) can be uniformly formed when forming the contact holes. That is, in the etch process for forming the contact holes in the dielectric layer 111, layers (i.e., etch targets) have a uniform thickness and have no steps. Accordingly, the etch thickness of etch targets can be easily controlled, and the problem of an open failure can be prevented. Furthermore, in the etch process for forming the contact holes in the dielectric layer 111, the dielectric layer 111 (i.e., an etch target) is formed to have a higher height than a top surface of the isolation layers. Accordingly, since the dielectric layer 111 remains distant from the gate insulating layer 103, the etch process can be performed without damaging the gate insulating layer 103.

Furthermore, the present disclosure can improve the contact resistance between the select lines and the first conductive layers because a contact area of the select lines and the first conductive layers can be widened by recessing a top surface of the first conductive layers 105a of regions where the select lines will be formed.

FIGS. 4A to 4F are sectional views illustrating a peripheral region defined outside a memory cell region and selection transistor regions. Transistors constituting a circuit for driving the select transistors and the memory cells are formed in the peripheral region.

Figure 4A:
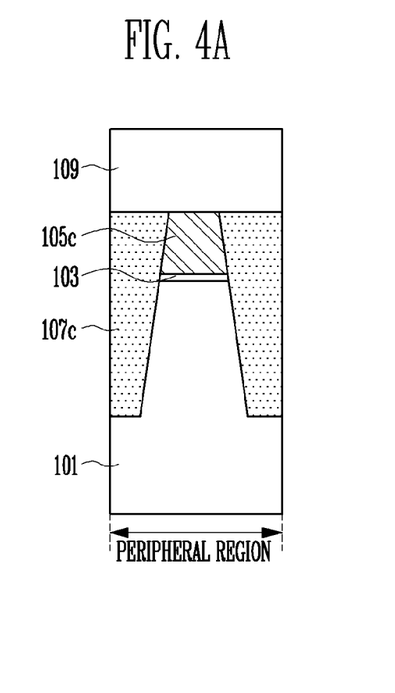
FIGS. 4A to 4F are sectional views illustrating a peripheral region defined outside a memory cell region and selection transistor regions.

Referring to FIG. 4A, when forming the first and second isolation layers 107a and 107b described above with reference to FIGS. 2 and 3A, third isolation layers 107c are formed in the peripheral region simultaneously with the first and second isolation layers 107a and 107b. It will be understood that the term "third isolation layers 107c" can refer to the isolation layer elements disposed in the peripheral region. Furthermore, the gate insulating layer 103 and third conductive layers 105c are formed in the semiconductor substrate 101 between the third isolation layers 107c. It will be understood that the term "third conductive layers 105c" can refer to the conductive layer elements disposed in the peripheral region. A method of forming the third isolation layers 107c is identical to the method of forming the first and second isolation layers 107a and 107b described above with reference to FIGS. 2 and 3A, and so the height of the third isolation layers 107c is equal to that of the first isolation layers 107a and the second isolation layers 107b before etching.

The first photoresist pattern 109 described above with reference to FIGS. 2 and 3A is formed to further cover the third isolation layers 107c. That is, the first photoresist pattern 109 is formed to further cover stacks on the peripheral region.

Figure 4B:
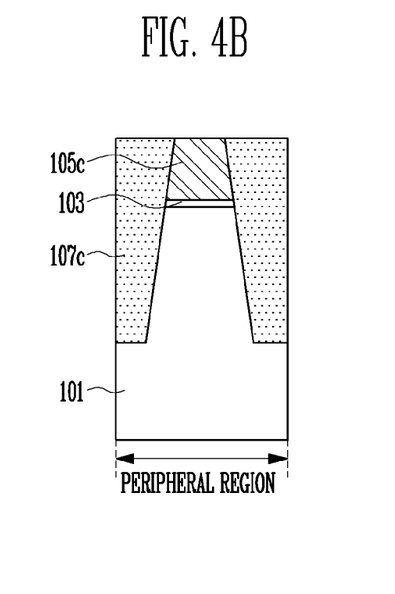

Referring to FIG. 4B, when performing the etch process of the second isolation layers 107b described above with reference to FIGS. 2 and 3B, the peripheral region is covered with the first photoresist pattern (refer to 109 of FIG. 4A). Accordingly, although the height of the second isolation layers 107b is decreased (lowered), the height of the third isolation layers 107c can remain intact. Consequently, the height of the third isolation layers 107c can remain higher than that of the second isolation layers 107b in the same manner as the first isolation layers 107a.

As described above with reference to FIGS. 2 and 3B, the first photoresist pattern (refer to 109 of FIG. 4A) is removed.

Figure 4C:
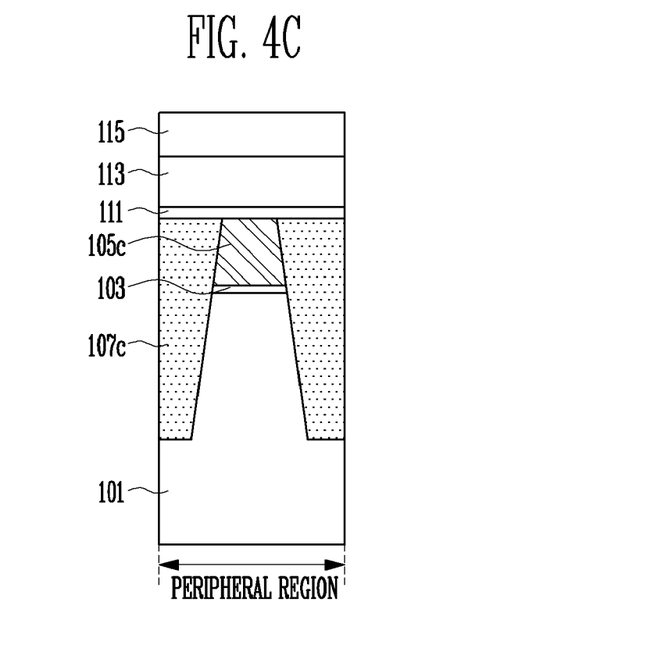

Referring to FIG. 4C, when stacking the dielectric layer 111, the capping layer 113, and the BARC layer 115 (described above with reference to FIGS. 2 and 3C), the dielectric layer 111, the capping layer 113, and the BARC layer 115 are also stacked over the semiconductor substrate 101 of the peripheral region, including the third isolation layers 107c and the third conductive layers 105c. The second photoresist pattern 117 described above with reference to FIGS. 2 and 3C is then formed. Here, the second photoresist pattern 117 is formed to leave open not only the BARC layer 115 formed in the selection transistor regions, but also the BARC layer 115 formed in the peripheral region.

In the present disclosure, the dielectric layer 111, the capping layer 113, and the BARC layer 115 on the peripheral region can be formed to have a uniform thickness because the surface of the semiconductor substrate 101, including the third isolation layers 107c and the third conductive layers 105c, on which they are stacked, is flat.

Figure 4D:
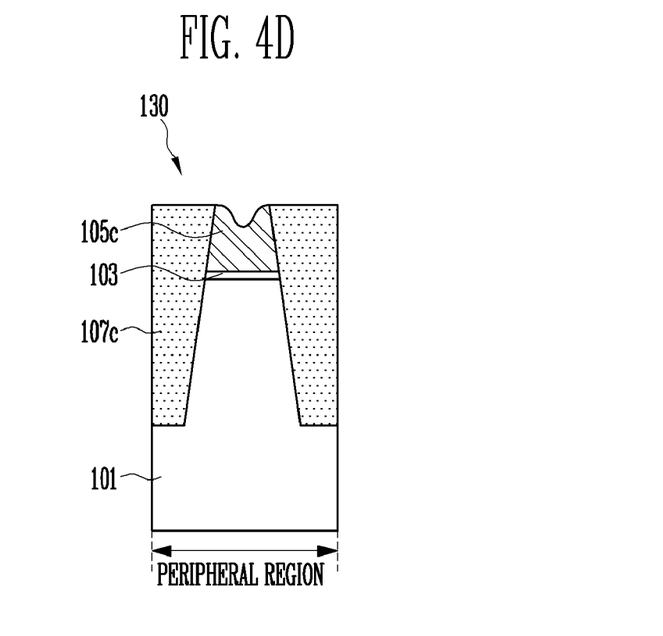
Figure 4E:
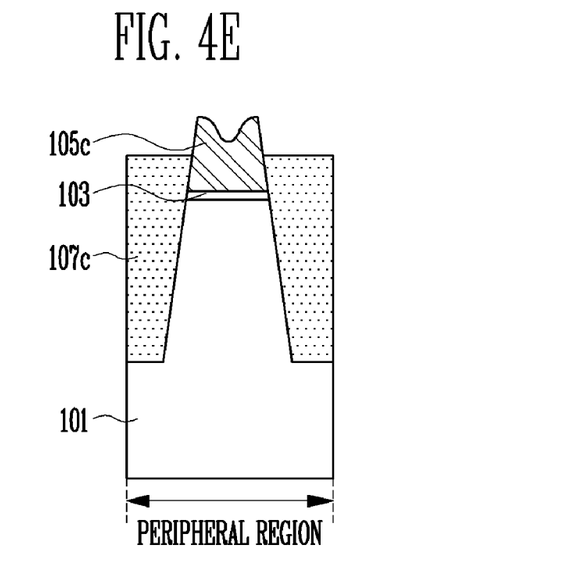

Referring to FIG. 4D, in the etch process described above with reference to FIGS. 2 and 3D, the BARC layer (refer to 115 of FIG. 4C), the capping layer (refer to 113 of FIG. 4C), and the dielectric layer (refer to 111 of FIG. 4C) on the peripheral region are also etched. Thus, contact holes 130, which expose the third conductive layers 105c and the third isolation layers 107c formed in the peripheral region, are further formed in the dielectric layer 111 in the peripheral region.

Next, in the recess process of the first conductive layers 105a described above with reference to FIGS. 2 and 3D, the third conductive layers 105c formed in the peripheral region are also recessed simultaneously with the first conductive layers 105a formed in the selection transistor regions. Thus, a top surface of each of the third conductive layers 105c becomes concave.

Furthermore, in the cleaning process described above with reference to FIGS. 2 and 3D, the sidewalls of the third conductive layers 105c formed in the peripheral region, together with the sidewalls of the first conductive layers 105a formed in the selection transistor regions are also exposed.

Figure 4F:
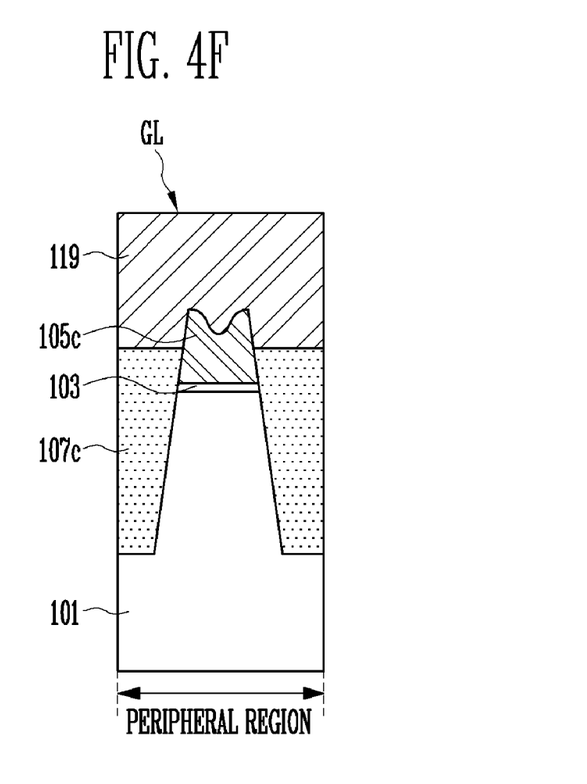

Referring to FIG. 4F, when forming the select lines and the word lines (described above with reference to FIGS. 2 and 3F), gate lines GL are also formed in the peripheral region. As described above with reference to FIGS. 2 and 3F, the conductive layer 119 for control gates may be used as the gate lines GL formed in the peripheral region.

As described above with reference to FIGS. 4A to 4F, when forming the contact holes in the dielectric layer 111, the same process is applied to the selection transistor regions and the peripheral region. Accordingly, a contact area of the conductive layer, including first, second, and third conductive layers 105a, 105b, and 105c and the conductive layer 119 for control gate in the selection transistor regions and the peripheral region, respectively, can be improved at the same time without additional processes.

According to this disclosure, in the process of forming the contact holes 120 in the dielectric layer 111, steps can be prevented from occurring between the first isolation layers 107a and the first conductive layers 105a under the select lines. Accordingly, in the etch process for forming the contact holes 120 in the dielectric layer 111, the etch thickness of layers (i.e., etch targets) can be easily controlled and the problem of an open failure can be prevented because the thickness of the layers becomes uniform.

Furthermore, according to the present disclosure, since the second isolation layers 107b in the memory cell region are etched to have a lower height than the first isolation layers 107a formed in the selection transition regions, the dielectric layer 111 (i.e., an etch target) is formed over the first isolation layers 107a under the select lines. Accordingly, the distance between the dielectric layer 111 and the gate insulating layer 103 (i.e., etch targets) can be increased because the height of the first isolation layers 105a under the select lines is large. Accordingly, the present disclosure can prevent the gate insulating layer 103 from being damaged when the etch process is performed on the dielectric layer 111.

Furthermore, according to the present disclosure, the height of the first isolation layers 107a under the select lines is higher than that of the second isolation layers 107b formed in the memory cell region. Thus, although part of the first isolation layers 105a under the select lines is lost in the process of recessing the first conductive layers 105a, the gate insulating layer 103 is not damaged. That is, in the present disclosure, although the process of recessing the first conductive layers 105a is performed in order to widen a contact area of the select lines and the first conductive layers 105a, the height of the first isolation layers 107a under the select lines has a margin enough to protect the gate insulating layer 103. Accordingly, according to the present disclosure, a process of improving the contact resistance between the select lines and the first conductive layers 105a can be stably carried out.

While the present invention has now been described and exemplified with some specificity, those skilled in the art will appreciate the various modifications, including variations, additions, and omissions that may be made in what has been described. Accordingly, it is intended that these modifications also be encompassed by the present invention and that the scope of the present invention be limited solely by the broadest interpretation that lawfully can be accorded the appended claims.

What is claimed is:

1. A method of manufacturing a flash memory device, comprising:
providing a semiconductor substrate, comprising selection transistor regions, a memory cell region defined between the selection transistor regions, and a peripheral region;
stacking a gate insulating layer and a conductive layer over the semiconductor substrate;
forming trenches by etching the conductive layer, the gate insulating layer, and the semiconductor substrate, thereby forming first conductive patterns over the selection transistor regions, second conductive patterns over the memory cell region, and third conductive patterns over the peripheral region;
forming first, second, and third isolation layers to a same height, wherein the first isolation layers are formed in the trenches of the selection transistor regions, the second isolation layers are formed in the trenches of the memory cell region, and the third isolation layers are formed in the trenches of the peripheral region;
forming a first photoresist pattern over the first and third isolation layers, wherein the second isolation layers are exposed;
lowering the height of the second isolation layers by performing an etch process using the first photoresist pattern as an etch barrier; and
removing the first photoresist pattern.

2. The method of claim 1, wherein:
the selection transistor regions comprise a source selection transistor region and a drain selection transistor region, and
the memory cell region is defined between the source selection transistor region and the drain selection transistor region.

3. The method of claim 1, comprising forming the first isolation layers and the second isolation layers adjacent and coupled to each other.

4. The method of claim 1, comprising forming the first, second, and third isolation layers to the same height by:
gap-filling the trenches with an insulation material; and
polishing a surface of the insulation material to expose the first, second, and third conductive patterns.

5. The method of claim 1, wherein after the first photoresist pattern is removed, the height of the first and second isolation layers remains higher than the height of the gate insulating layer.

6. The method of claim 1, further comprising, after the first photoresist pattern is removed:
forming a dielectric layer over the semiconductor substrate, including the first, second, and third isolation layers and the first, second, and third conductive patterns;
etching the dielectric layer to thereby expose the first and third conductive patterns and the first and third isolation layers formed in the selection transistor regions and the peripheral region; and
forming select lines in contact with the first conductive patterns and the first isolation layers formed in the selection transistor regions and word lines in contact with the dielectric layer formed in the memory cell region.

7. The method of claim 6, further comprising, after the dielectric layer is formed:
forming a capping layer on the dielectric layer using polysilicon;
forming a second photoresist pattern over the capping layer; and
etching the capping layer by an etch process using the second photoresist pattern as an etch barrier.

8. The method of claim 7, wherein the capping layer is etched using an etch gas comprising HBr gas and $O_2$ gas.

9. The method of claim 6, wherein after the dielectric layer is etched, the height of the first isolation layers remains higher than the height of the gate insulating layer, and the height of the first isolation layers is lower than the height of the first conductive patterns.

10. The method of claim 9, comprising lowering the height of the first isolation layers by performing a cleaning process using hydrofluoric acid (HF) solution.

11. The method of claim 9, wherein the select lines contact a top surface and sidewalls of the first conductive patterns.

12. The method of claim 6, comprising recessing the surfaces of each of the first conductive patterns after the dielectric layer is etched.

13. The method of claim 12, comprising recessing the surfaces of each of the first conductive patterns using an etch gas including HBr gas and $N_2$ gas.

14. The method of claim 12, comprising recessing the surfaces of the first conductive patterns by applying a bias power that is lower than a bias power applied when the dielectric layer is etched.

* * * * *